United States Patent
Inagawa et al.

(10) Patent No.: US 7,910,985 B2
(45) Date of Patent: Mar. 22, 2011

(54) SEMICONDUCTOR DEVICE AND METHOD FOR FABRICATING THE SAME

(75) Inventors: Hiroshi Inagawa, Maebashi (JP);
Nobuo Machida, Takasaki (JP);
Kentaro Ooishi, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/759,858

(22) Filed: Apr. 14, 2010

(65) Prior Publication Data

US 2010/0193863 A1     Aug. 5, 2010

Related U.S. Application Data

(60) Division of application No. 12/071,542, filed on Feb. 22, 2008, now abandoned, which is a continuation of application No. 11/483,547, filed on Jul. 11, 2006, now Pat. No. 7,358,141, which is a continuation of application No. 11/045,148, filed on Jan. 31, 2005, now Pat. No. 7,098,506, which is a continuation of application No. 10/657,246, filed on Sep. 9, 2003, now Pat. No. 6,861,703, which is a division of application No. 09/604,903, filed on Jun. 28, 2000, now Pat. No. 6,638,850.

(51) Int. Cl.
*H01L 29/76*     (2006.01)

(52) U.S. Cl. .. 257/328; 257/330; 257/333; 257/E21.418

(58) Field of Classification Search .......... 257/328–345, 257/E21.418

See application file for complete search history.

(56) References Cited

U.S. PATENT DOCUMENTS

| | | | |
|---|---|---|---|
| 4,666,556 A | 5/1987 | Fulton et al. | |
| 4,835,585 A | 5/1989 | Panousis | |
| 4,879,254 A | 11/1989 | Tsuzuki et al. | |
| 5,173,435 A | 12/1992 | Harada | |
| 5,237,187 A | 8/1993 | Suwanai et al. | |
| 5,298,781 A | 3/1994 | Cogan et al. | |
| 5,326,711 A | 7/1994 | Malhi | |
| 5,366,914 A | 11/1994 | Takahashi et al. | |
| 5,597,765 A | 1/1997 | Yilmaz et al. | |
| 5,612,557 A | 3/1997 | Kondo et al. | |
| 5,621,232 A | 4/1997 | Ohno | |
| 5,623,152 A | 4/1997 | Majumdar et al. | |

(Continued)

FOREIGN PATENT DOCUMENTS

JP     63-308387 A     12/1988

(Continued)

*Primary Examiner* — H. Jey Tsai

(74) *Attorney, Agent, or Firm* — Mattingly & Malur, P.C.

(57) ABSTRACT

Described is a method for fabricating a semiconductor device having an FET of a trench-gate structure obtained by disposing a conductive layer, which will be a gate, in a trench extended in the main surface of a semiconductor substrate, wherein the upper surface of the trench-gate conductive layer is formed equal to or higher than the main surface of the semiconductor substrate. In addition, the conductive layer of the trench gate is formed to have a substantially flat or concave upper surface and the upper surface is formed equal to or higher than the main surface of the semiconductor substrate. Moreover, after etching of the semiconductor substrate to form the upper surface of the conductive layer of the trench gate equal to or higher than the main surface of the semiconductor substrate, a channel region and a source region are formed by ion implantation. The semiconductor device thus fabricated according to the present invention is free from occurrence of a source offset.

12 Claims, 14 Drawing Sheets

U.S. PATENT DOCUMENTS

| | | |
|---|---|---|
| 5,717,254 A | 2/1998 | Hashimoto et al. |
| 5,734,175 A | 3/1998 | Taniguchi |
| 5,795,793 A | 8/1998 | Kinzer |
| 5,940,721 A | 8/1999 | Kinzer et al. |
| 5,972,768 A | 10/1999 | Nagayasu et al. |
| 6,008,114 A | 12/1999 | Li |
| 6,015,737 A * | 1/2000 | Tokura et al. ............ 438/270 |
| 6,107,196 A | 8/2000 | Rolfson |
| 6,144,067 A * | 11/2000 | Kinzer ...................... 257/335 |
| 6,180,981 B1 | 1/2001 | Kinzer et al. |
| 6,211,549 B1 * | 4/2001 | Funaki et al. ............ 257/329 |
| 6,238,981 B1 | 5/2001 | Grebs |
| 6,406,998 B1 | 6/2002 | Prall et al. |
| 6,437,399 B1 | 8/2002 | Huang |
| 6,472,317 B1 | 10/2002 | Wang et al. |
| 6,482,735 B1 | 11/2002 | Givens et al. |
| 6,638,850 B1 | 10/2003 | Inagawa et al. |
| 6,861,703 B2 * | 3/2005 | Inagawa et al. ............ 257/330 |
| 7,098,506 B2 * | 8/2006 | Inagawa et al. ............ 257/330 |

FOREIGN PATENT DOCUMENTS

| | | |
|---|---|---|
| JP | 1-125979 A | 5/1989 |
| JP | 3-104284 A | 5/1991 |
| JP | 3-240273 A | 10/1991 |
| JP | 5-315620 A | 11/1993 |
| JP | 9-172175 A | 6/1997 |
| JP | 10-505198 A | 5/1998 |
| JP | 2000-196075 | 7/2000 |

* cited by examiner

SEMICONDUCTOR DEVICE AND METHOD FOR FABRICATING THE SAME

This application is a divisional application of U.S. application Ser. No. 12/071,542, filed Feb. 22, 2008, which is a continuation application of U.S. application Ser. No. 11/483,547, filed Jul. 11, 2006, now U.S. Pat. No. 7,358,141, which is a continuation of U.S. application Ser. No. 11/045,148, filed on Jan. 31, 2005, now U.S. Pat. No. 7,098,506, which is a continuation of U.S. application Ser. No. 10/657,246, filed Sep. 9, 2003, now U.S. Pat. No. 6,861,703, which is a divisional of Ser. No. 09/604,903, filed Jun. 28, 2000, now U.S. Pat. No. 6,638,850.

BACKGROUND OF THE INVENTION

This invention relates to a semiconductor device, particularly, a technique effective when adapted to a semiconductor device having a trench-gate structure.

A power transistor has been used for various applications including a power amplifier circuit, power supply circuit, converter and power supply protective circuit. Since it treats high power, it is required to have high breakdown voltage and to permit high current.

In the case of MISFET (Metal Insulator Semiconductor Field Effect Transistor), high current can be attained easily by an expansion of a channel width. In order to avoid an increase in a chip area caused by expansion of a channel width, a mesh-gate structure is, for example, employed.

Gates are two-dimensionally arranged in the form of a lattice in the mesh-gate structure so that a channel width per unit chip area can be enlarged. A description of an FET having a mesh-gate structure can be found on pages 429 to 430 of "Semiconductor Handbook" published by Ohmsha Limited or U.S. Pat. No. 5,940,721.

For such a power FET, a planar structure has conventionally been employed because its fabrication process is simple and an oxide film which will be a gate insulating film can be formed easily. In the above-described U.S. Pat. No. 5,940,721 shown is an FET having a planar structure.

The FET having a planar structure is however accompanied with the drawbacks that when a gate is formed narrowly, the channel length becomes short and a short-channel effect appears because the channel length is determined depending on the gate length; or when a gate is formed narrowly, an allowable current decreases because the gate has additionally a function of wiring. It is therefore impossible to conduct miniaturization freely. With the foregoing in view, adoption of an FET having a trench-gate structure is considered because it can improve the integration degree of cells and in addition, reduce an on resistance.

The trench-gate structure is formed by disposing, via an insulating film, a conductive layer, which will serve as a gate, in a trench extended in the main surface of a semiconductor substrate and in this structure, the deeper portion and the outer surface portion of the main surface serve as a drain region and a source region, respectively and a semiconductor layer between the drain and source regions serves as a channel forming region. Such a structure is described, for example, in U.S. Pat. No. 5,918,114.

The present inventors developed a technique for introducing impurities into a source region or channel forming region of an MISFET having a trench-gate structure after the formation of a trench gate with a view to preventing a deterioration of a gate insulating film or a fluctuation in a threshold voltage owing to the impurities in the source region or channel forming region and have already applied for a patent as U.S. patent application Ser. No. 09/137,508.

SUMMARY OF THE INVENTION

With an advance of the miniaturization of a device, there is a tendency to make the source region shallower. When the source region becomes shallower, however, it becomes difficult to place a trench gate at a precise position and the end portion of the trench gate does not overlap with the source region. If a source offset occurs, in other words, the trench gate gets out of the source region, by inaccurate positioning of the trench gate, this source offset impairs the functioning of the FET.

An object of the present invention is to provide a technique capable of overcoming the above-described problem and preventing the occurrence of a source offset.

The above-described and the other objects and novel features of the present invention will be apparent from the description herein and accompanying drawings.

Among the inventions disclosed by the present application, representative ones will next be summarized simply.

Provided is a semiconductor device equipped with an FET of a trench-gate structure having a conductive layer, which will be a gate, disposed in a trench extended in the main surface of a semiconductor substrate, wherein the upper surface of the trench-gate conductive layer or gate electrode is formed equal to or higher than the main surface of the semiconductor substrate.

Also provided is a semiconductor device equipped with an FET of a trench-gate structure having a conductive layer, which will be a gate, disposed in a trench extended in the main surface of a semiconductor substrate, wherein the trench-gate conductive layer (gate electrode) has a substantially flat or convex upper surface and this upper surface of the trench-gate conductive layer is formed equal to or higher than the main surface of the semiconductor substrate.

Also provided is a semiconductor device equipped with an FET of a trench-gate structure having a conductive layer, which will be a gate, disposed in a trench extended in the main surface of a semiconductor substrate, wherein the upper surface of the trench-gate conductive layer is formed equal to or higher than the main surface of the semiconductor substrate and the trench gate has, at the terminal portion thereof, a field relaxing portion disposed.

Also provided is a fabrication method of a semiconductor device equipped with an FET of a trench-gate structure having a conductive layer, which will be a gate, disposed in a trench extended in the main surface of a semiconductor substrate, which comprises:

forming a trench, wherein a trench-gate will be formed, in the main surface of the semiconductor substrate;

forming a gate insulating film in the trench, forming a trench gate in the trench, forming an insulating film over the main surface of the semiconductor substrate by thermal oxidation so that the film on the trench gate becomes thicker than that on the main surface of the semiconductor substrate by making use of the accelerated oxidation phenomenon, removing the insulating film by etching and while leaving the thickly formed insulating film on the trench gate, exposing the main surface of the semiconductor substrate, and selectively removing the semiconductor substrate relative to the insulating film by etching, thereby forming the upper surface of the trench gate covered with the insulating film equal to or higher than the main surface of the semiconductor substrate.

Also provided is a fabrication method of a semiconductor device equipped with an FET of a trench-gate structure having a conductive layer, which will be a gate, disposed in a trench extended in the main surface of a semiconductor substrate, which comprises:

forming a trench, wherein a trench-gate will be formed, on the main surface of the semiconductor substrate;

forming a gate insulating film in the trench, forming a trench gate in the trench, forming an insulating film over the main surface of the semiconductor substrate by thermal oxidation so that the film on the trench gate becomes thicker than that on the main surface of the semiconductor substrate by making use of the accelerated oxidation phenomenon, removing the insulating film by etching and while leaving the thickly formed insulating film on the trench gate, exposing the main surface of the semiconductor substrate, selectively removing the semiconductor substrate relative to the insulating film by etching, thereby forming the upper surface of the trench gate covered with the insulating film equal to or higher than the main surface of the semiconductor substrate, and subsequent to the selective etching, introducing impurities from the main surface of the semiconductor substrate, thereby forming a channel forming region and a source region.

Also provided is a fabrication method of a semiconductor device equipped with an FET of a trench-gate structure having a conductive layer, which will be a gate, disposed in a trench extended in the main surface of the semiconductor substrate, which comprises:

forming a trench, wherein a trench-gate will be formed, on the main surface of the semiconductor substrate, forming a gate insulating film in the trench, forming a polycrystalline silicon film, which will be a conductive film for the trench gate, all over the main surface of the semiconductor substrate, removing the polycrystalline silicon film by using etching and multi-stage oxidation in combination, thereby forming, in the trench, a trench gate having a substantially flat or concave upper surface, forming an insulating film over the main surface of the semiconductor substrate by thermal oxidation so that the film on the trench gate becomes thicker than that on the main surface of the semiconductor substrate by making use of accelerated oxidation phenomenon, removing the insulating film by etching and while leaving the thickly formed insulating film on the trench gate, exposing the main surface of the semiconductor substrate, selectively removing the semiconductor substrate relative to the insulating film by etching, thereby forming the upper surface of the trench gate covered with the insulating film equal to or higher than the main surface of the semiconductor substrate, and subsequent to the selective etching, introducing impurities from the main surface of the semiconductor substrate, thereby forming a channel forming region and a source region.

Described is a fabrication method of a semiconductor device equipped with an FET of a trench-gate structure having a conductive layer, which will be a gate, disposed in a trench extended in the main surface of the semiconductor substrate, which comprises:

disposing a field relaxing portion at the terminal portion of the trench gate, forming a trench, wherein a trench-gate will be formed, on the main surface of the semiconductor substrate;

forming a gate insulating film in the trench, forming a trench gate in the trench, forming an insulating film over the main surface of the semiconductor substrate by thermal oxidation so that the film on the trench gate becomes thicker than that on the main surface of the semiconductor substrate by making use of accelerated oxidation phenomenon, removing the insulating film by etching and while leaving the thickly formed insulating film on the trench gate, exposing the main surface of the semiconductor substrate, selectively removing the semiconductor substrate relative to the insulating film by etching, thereby forming the upper surface of the trench gate covered with the insulating film equal to or higher than the main surface of the semiconductor substrate, and subsequent to the selective etching, introducing impurities from the main surface of the semiconductor substrate, thereby forming a channel forming region and a source region.

Also provided is a fabrication method of a semiconductor device, which comprises:

forming a trench, wherein a trench-gate will be formed, on the main surface of the semiconductor substrate;

forming a gate insulating film in the trench, forming a trench gate in the trench, forming an insulating film over the main surface of the semiconductor substrate by thermal oxidation so that the film on the trench gate becomes thicker than that on the main surface of the semiconductor substrate by making use of the accelerated oxidation phenomenon, forming a mask film over the insulating film on the trench gate, removing the insulating film by isotropic etching by using the mask film and while leaving the insulating film formed thickly on the trench gate, exposing the main surface of the semiconductor substrate, and selectively removing the semiconductor substrate relative to the insulating film by etching, thereby forming the upper surface of the trench gate covered with the insulating film equal to or higher than the main surface of the semiconductor substrate.

Also provided is a fabrication method of a semiconductor device, which comprises:

(1) forming a semiconductor layer containing first conductivity type impurities over the main surface of a semiconductor body containing first conductivity type impurities, (2) forming a field insulating film in a selected region on the main surface of the semiconductor layer, (3) forming a trench in the semiconductor layer, (4) forming a gate insulating film over the surface inside of the trench, (5) embedding a gate layer inside of the trench wherein the gate insulating film has been formed, (6) etching the main surface of the semiconductor layer so that the main surface of the semiconductor layer becomes lower than the end portion of the gate layer contiguous to the gate insulating film, (7) introducing second conductivity type impurities in the semiconductor layer, thereby forming, in the semiconductor layer, a first semiconductor region which is positioned shallower than the bottom of the trench and at the same time, is in contact with the gate insulating film, and (8) introducing first conductivity type impurities in the first semiconductor region, thereby forming, in the first semiconductor region, a second semiconductor region which is positioned shallower than the first semiconductor region and at the same time, is contact with the gate insulating film.

Also provided is a method for fabricating a semiconductor integrated circuit device, which comprises:

etching both an insulating film formed over the main surface of a semiconductor substrate and the semiconductor substrate, thereby forming a connecting hole reaching the inside of the semiconductor substrate, causing selective retreat of the insulating film relative to the semiconductor substrate, thereby widening the connecting hole so as to expose the main surface of the semiconductor substrate, and forming a conductive film in the connecting hole.

Also provided is a semiconductor integrated circuit device, wherein a connecting hole is formed in an insulating film formed over the main surface of a semiconductor substrate so as to reach the semiconductor substrate, the connecting hole has an exposing portion of the main surface of the semiconductor substrate and a portion reaching the semiconductor substrate, a conductive film is formed in the connecting hole, and the conductive film is electrically connected with the semiconductor substrate both at the exposing portion of the main surface of the semiconductor substrate and the portion reaching the semiconductor substrate.

By the above-described means, the upper surface of the trench-gate conductive layer is formed equal to or higher than the main surface of the semiconductor substrate, making it possible to prevent a source offset.

DETAILED DESCRIPTION OF THE PREFERRED EMBODIMENTS

Figure 1:
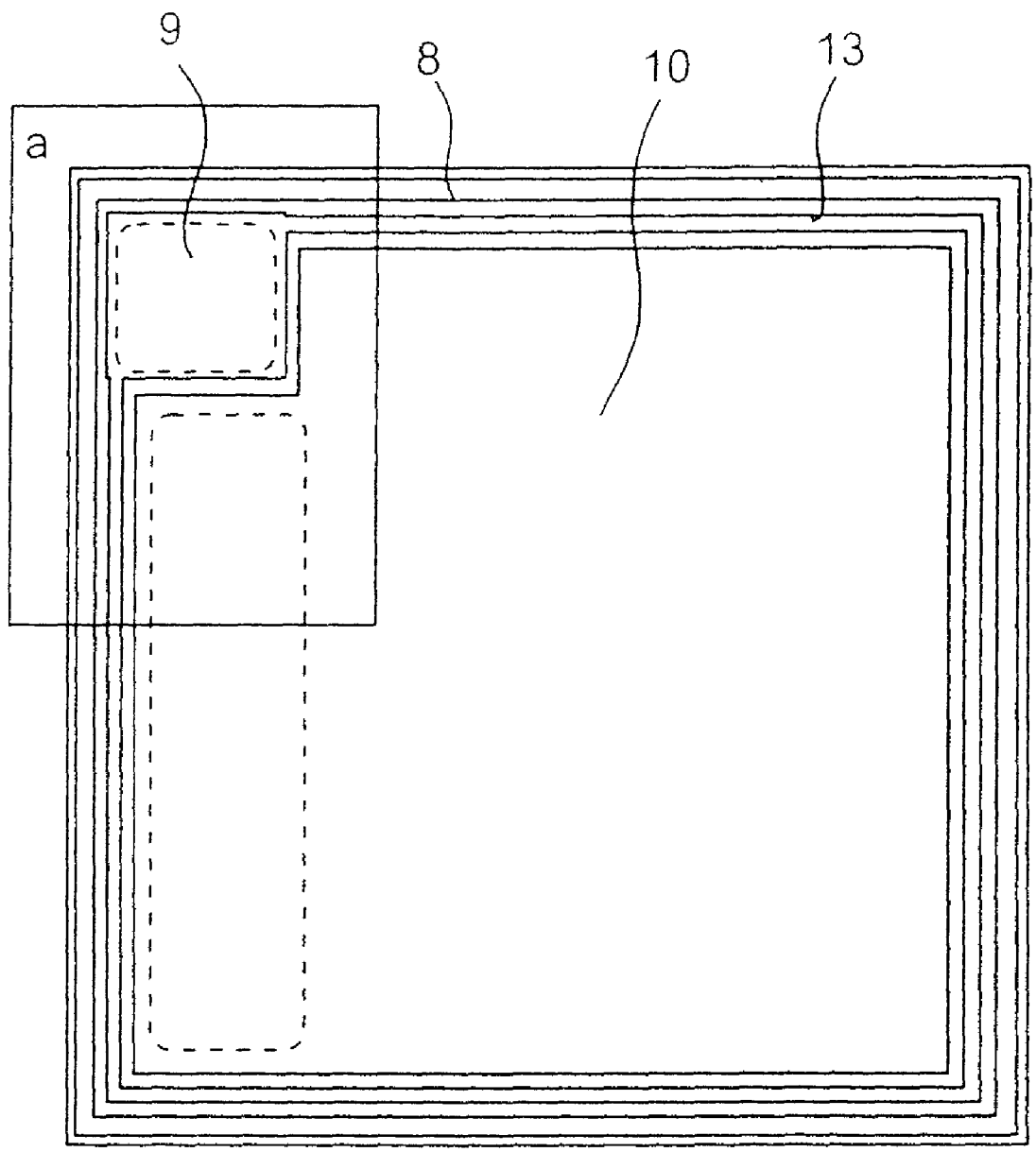
FIG. 1 is a plan view illustrating a semiconductor device according to Embodiment 1 of the present invention.

The embodiments of the present invention will hereinafter be described. In all the drawings for describing the embodiments, like members of a function will be identified by like reference numerals and overlapping descriptions will be omitted.

Embodiment 1

Figure 2:
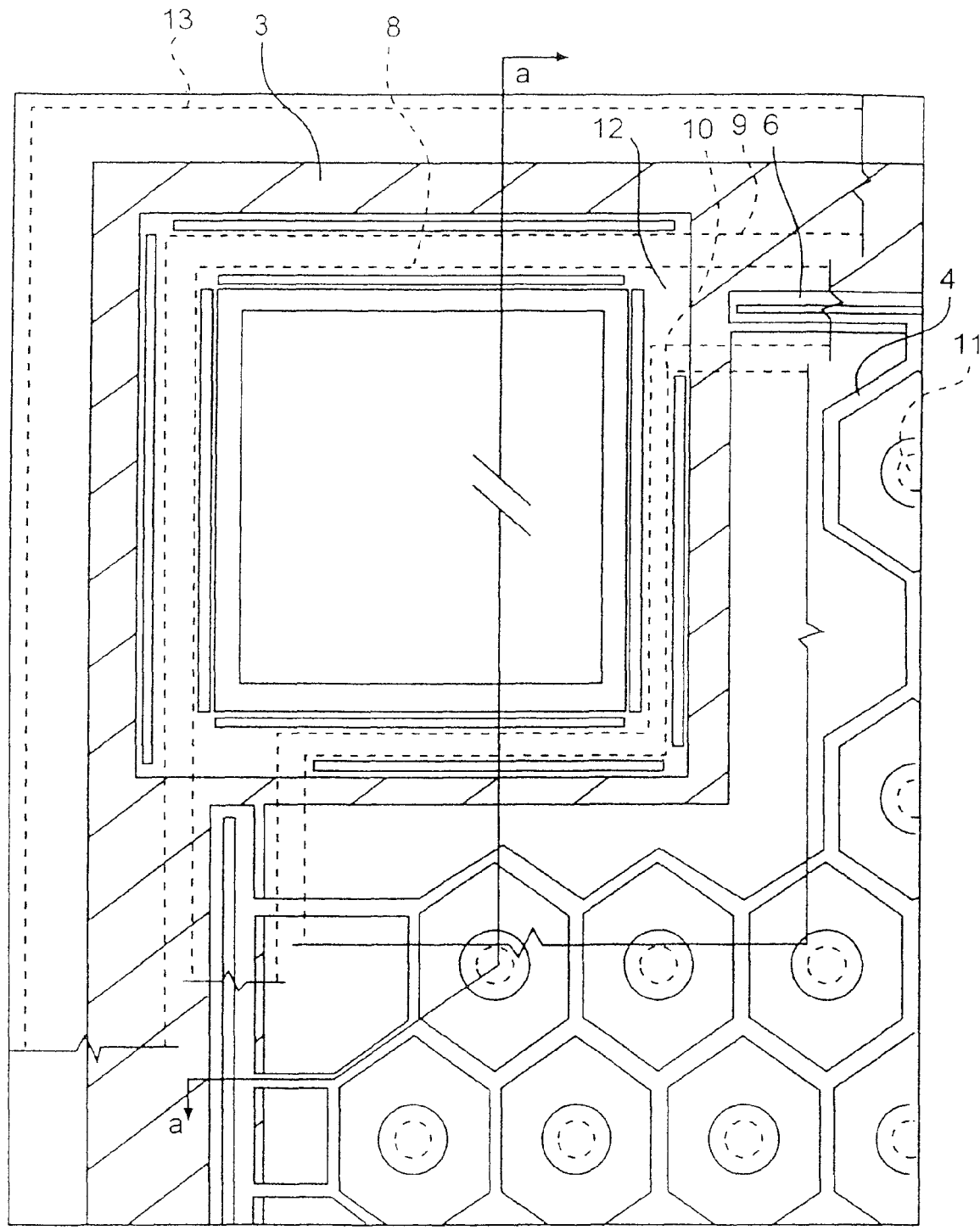
FIG. 2 is a fragmentary plan view illustrating the semiconductor device according to Embodiment 1 of the present invention.
Figure 3:
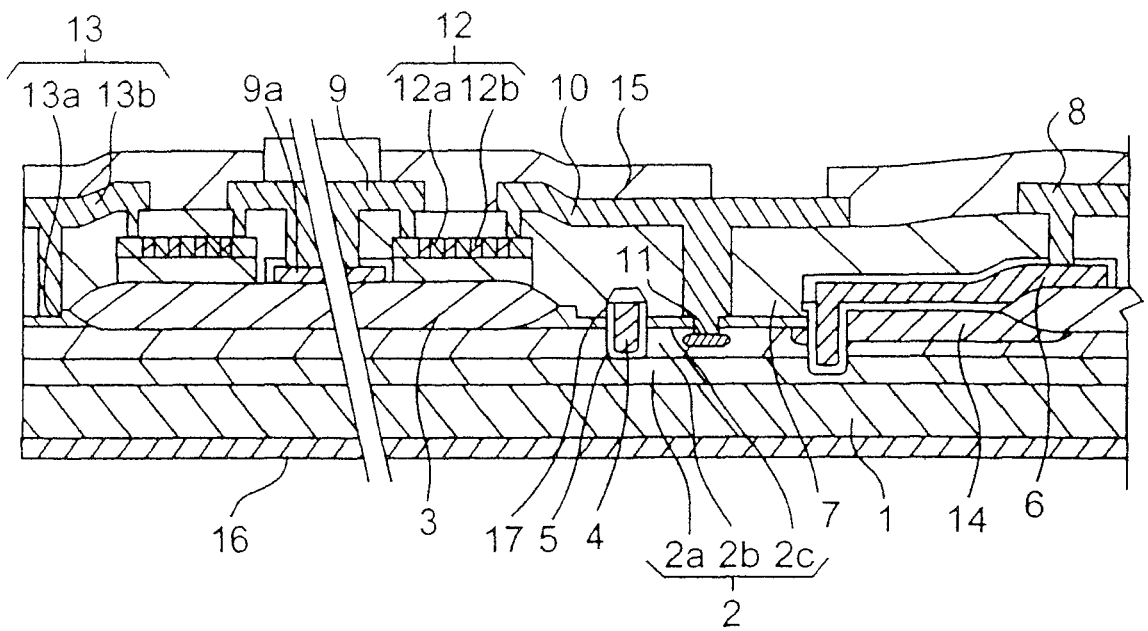
FIG. 3 is a partial longitudinal cross-sectional view taken along a line a-a of FIG. 2.

FIG. 1 is a plan view illustrating a power MISFET having a trench-gate structure, which will be the semiconductor device according to Embodiment 1 of the present invention, FIG. 2 is a fragmentary plan view illustrating the portion a of FIG. 1 in an enlarged scale and FIG. 3 is a longitudinal cross-sectional view taken along a line a-a of FIG. 2.

The MISFET of this embodiment is formed on a semiconductor substrate obtained, for example, by forming an epitaxial layer 2 on an n$^+$-type semiconductor body 1, for example, made of single crystal silicon by the epitaxial growth technique. This MISFET is disposed in the form of a rectangular ring along the outer periphery of the semiconductor substrate and it is formed within a region surrounded by a field insulating film 3 (shown by a double slash in FIG. 2) having a rectangular portion inside of the corner. Within the above-described region, a plurality of hexagonal or flat pentagonal cells (semiconductor island region) having a trench-gate structure are disposed regularly and a mesh-gate structure wherein gates are two-dimensionally disposed in the lattice form and cells are connected in parallel each other is formed. The trench-gate structure is thus formed to separate the main surface of the semiconductor substrate into semiconductor island regions for cells.

In each cell, that is, in each semiconductor island region, an n$^-$-type first semiconductor layer 2a formed over the semiconductor body 1 serves as a drain region, a p-type second semiconductor layer 2b formed over the first semiconductor layer 2a serves as a base region wherein a channel is to be formed, and an n$^+$-type third semiconductor layer 2c formed over the second semiconductor layer 2b serves as a source region, thus forming a vertical FET.

A trench gate (gate electrode) 4 is formed, via a gate insulating film 5, in a trench which extends from the main surface of the semiconductor substrate to the n$^-$-type second semiconductor layer 2a which will be a drain region. As the trench gate 4, for example impurity-introduced polycrystalline silicon is employed, while the gate insulating film 5 is made of a multilayer film obtained, for example, by successively stacking a thermal oxide film of about 27 nm thick and a deposition film of about 50 nm thick.

Figure 19:
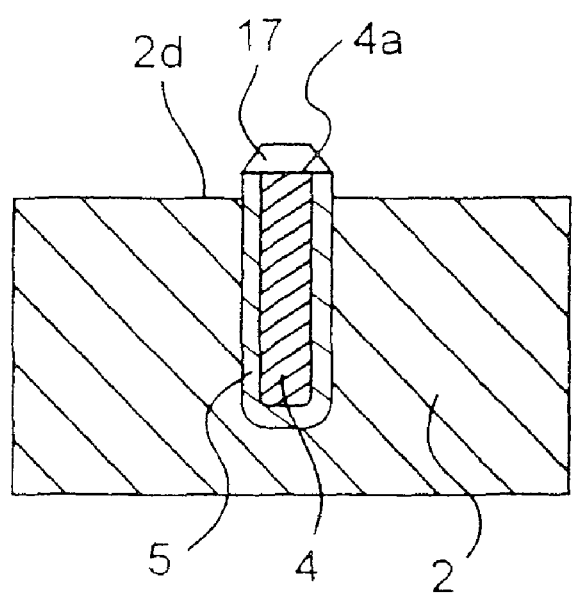
FIG. 19 is a partially-enlarged fragmentary cross-sectional view illustrating, in the order of steps, the semiconductor device according to Embodiment 1 of the present invention.
Figure 20:
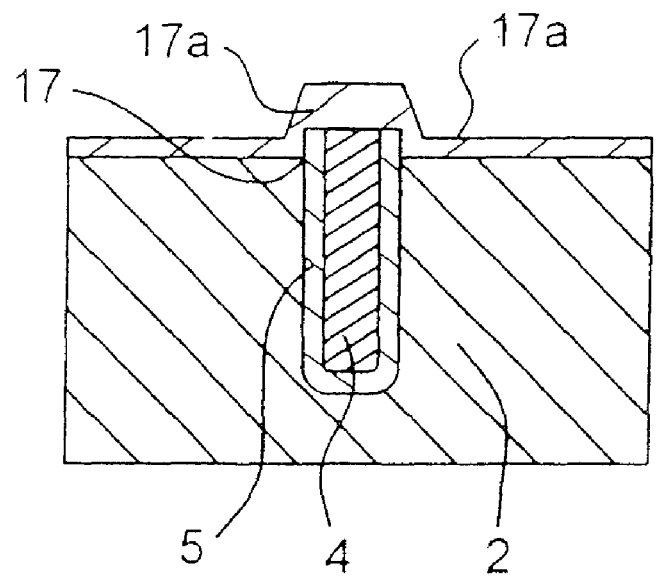
FIG. 20 is a partially-enlarged fragmentary cross-sectional view illustrating, in the order of steps, the semiconductor device according to Embodiment 1 of the present invention.
Figure 21:
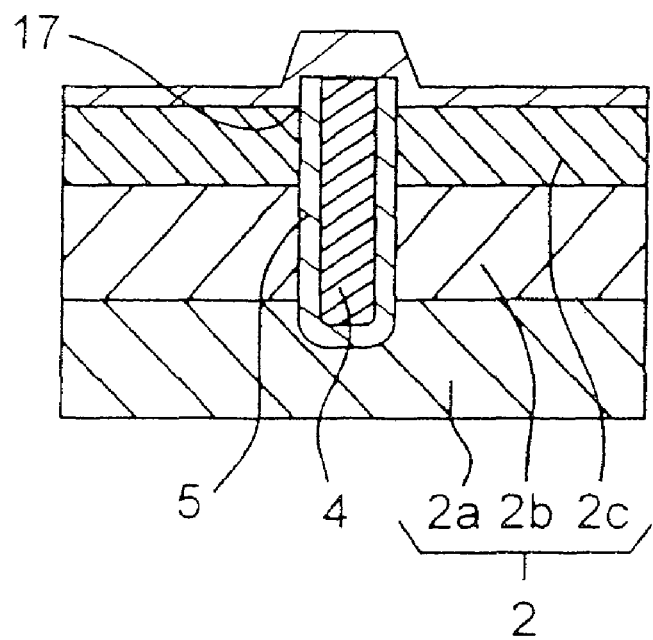
FIG. 21 is a partially-enlarged fragmentary cross-sectional view illustrating, in the order of steps, the semiconductor device according to Embodiment 1 of the present invention.

As illustrated in FIGS. 19 to 21 which will be described later, the upper surface 4a of the trench gate 4 of this embodiment is formed higher than the surface of the third semiconductor layer 2c, which will be a source region, that is, the main surface of the semiconductor substrate. Such a constitution makes it possible to prevent the trench gate 4 from getting out of the source region, that is, prevent occurrence of a source offset even if the source region is made shallow. The trench gate 4 is desired to have a substantially flat or convex upper surface.

The trench gates 4 of adjacent cells are connected each other, thus forming a mesh-gate structure wherein they are disposed two-dimensionally in the form of a lattice. The trench gate 4 of each of the cells positioned at the outer periphery is connected, for example, with a polycrystalline-silicon-made gate wiring 6 in the vicinity at the outer periphery of a semiconductor chip.

The gate wiring 6 is electrically connected with a gate guard ring 8 (partially shown by a broken line in FIG. 2) which is formed thereover through an interlayer insulating film 7 and is, for example, made of silicon-containing aluminum. The gate guard ring 8 is integrated with a rectangular gate electrode 9 (partially shown by a broken line in FIG. 2) which is disposed at the rectangular portion of the field insulating film 3. The gate electrode 9 has a connecting region (shown by a broken line in FIG. 1) with the gate 4.

A third semiconductor layer 2c, which will be a source, is electrically connected with a source wiring 10 (partially shown by a broken line in FIG. 2) which is formed over the main surface of the semiconductor substrate through the interlayer insulating film 7 and is, for example, made of silicon-containing aluminum. The source wiring 10 has a connecting region (shown by a broken line in FIG. 1) with the third semiconductor layer 2c, which will be a source. This source wiring 10 is electrically connected with not only third semiconductor layer 2c which will be a source but also a p$^+$-type contact layer 11 disposed in the second semiconductor layer 2b to make the base potential, that is, the potential of a channel forming region constant.

Figure 22:
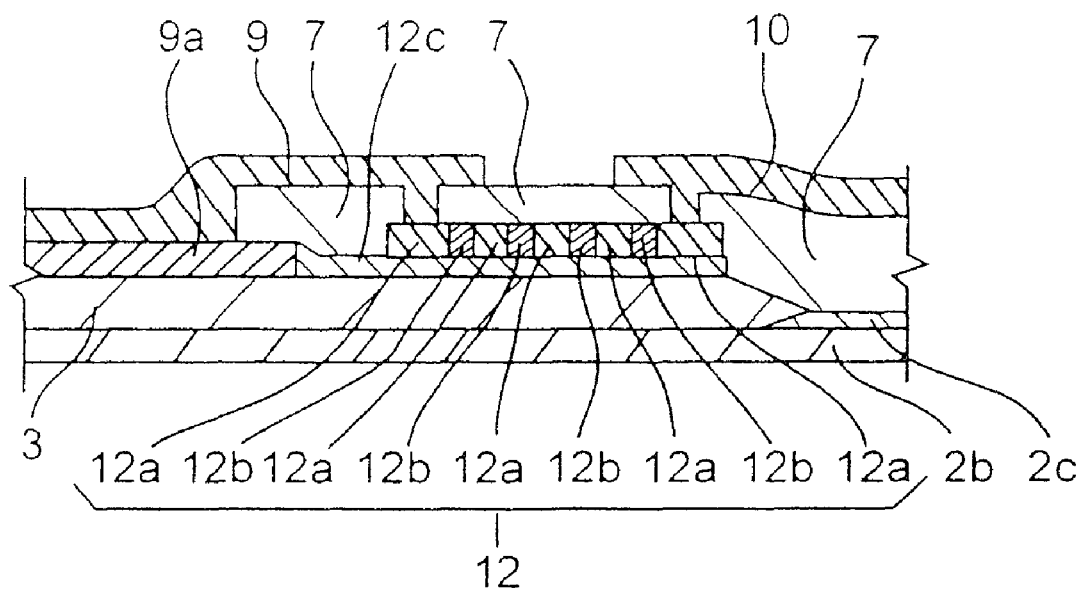
FIG. 22 is a partially-enlarged fragmentary cross-sectional view illustrating, in the order of steps, the semiconductor device according to Embodiment 1 of the present invention.
Figure 27:
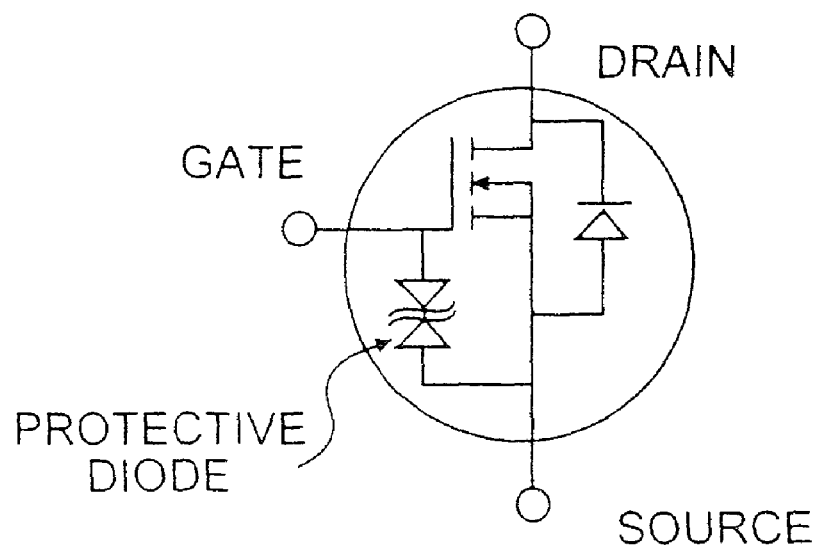
FIG. 27 is an equivalent circuit view of MISFET having a protective diode disposed thereon according to Embodiment 1 of the present invention.

As is illustrated in FIG. 3 or 22, a protective diode 12 having a back-to-back structure is disposed between the gate and source. In the protective diode 12, the n$^+$-type semiconductor regions 12a and p-type semiconductor regions 12b are alternately formed in the form of a concentric ring, and with the n$^+$-type semiconductor regions 12 at both ends are electrically connected the gate electrode 9 and source wiring 10, respectively. A shown in the circuit diagram of FIG. 27, the protective diode is disposed between the gate and the source for protecting breakdown of the gate insulating film from the surge from the source.

At the outer periphery of the field insulating film 3, disposed is a source guard ring 13 obtained by connecting an n$^+$-type semiconductor region 13a disposed over the main surface of the semiconductor substrate with a wiring 13b (partially shown by a broken line in FIG. 2), for example, made of silicon-containing aluminum. Similar to the source wiring 10, the wiring 13b of the source guard ring 13 is connected with the n$^+$-type semiconductor region 12a of the protective diode 12.

The gate wiring 6 and gate guard ring 8 are disposed over the field insulating film 3 disposed in the form of a rectangular ring, while the gate electrode 9 and protective diode 12 are disposed over the rectangular portion disposed at the corner of the field insulating film 3.

Along the field insulating film 3 in the rectangular ring form, a p-type well 14 is formed therebelow. By connecting the p-type well 14 with the terminal portion of the trench gate 4 through the gate insulating film 5, a depletion layer can be gently extended below the field insulating film 3 and discontinuity of the depletion layer can be prevented. The p-type well 14 therefore functions as a field relaxing portion for relaxing the electric field at the terminal portion of the trench gate 4.

All over the main surface of the semiconductor substrate, a protective insulating film 15 is formed, for example, by stacking polyimide on a silicon oxide film, which has been obtained by plasma CVD using as a main source gas tetra-ethoxysilane (TEOS), to cover the gate guard ring 8, gate electrode 9, source wiring 10 and source guard ring 13. A contact hole is made in this protective insulating film 15 to partially expose the gate electrode 9 and source wiring 10. The gate electrode 9 and source wiring 10 to be exposed by this contact hole will become connecting regions with the gate and source, respectively. Electric connection to each of these connecting regions is conducted by wire bonding or the like.

As the connecting region with the drain, a drain electrode 16 which is electrically conductive with the n$^+$-type semiconductor substrate 1 is formed, for example, as a nickel-titanium-nickel-silver laminated film all over the reverse side of the semiconductor substrate, and the drain electrode 16 is electrically connected with a lead frame by a conductive adhesive.

A fabrication method of the above-described semiconductor device will next be described based on FIGS. 4 to 26.

Figure 4:
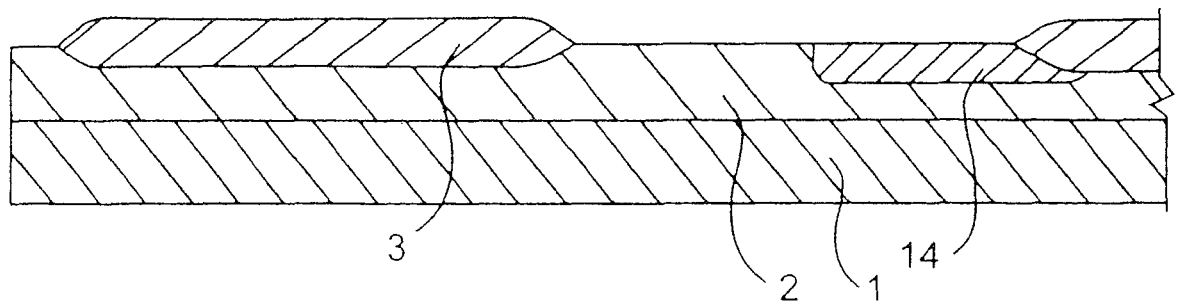
FIG. 4 is a longitudinal fragmentary cross-sectional view illustrating, in the order of steps, the semiconductor device according to Embodiment 1 of the present invention.

Over the n$^+$ semiconductor body 1, for example, made of single crystal silicon having arsenic (As) introduced therein, an n$^-$ type epitaxial layer 2 having a lower concentration than the semiconductor body 1 is formed to give a thickness of about 5 μm by epitaxial growth. A silicon oxide film of about 40 nm thick is then formed over the main surface of this semiconductor substrate, for example, by thermal oxidation, followed by the formation, as a mask of a silicon nitride (SiN) film over this silicon oxide film in the rectangular ring form along the outer periphery of the semiconductor substrate. A field insulating film 3 having a rectangular portion inside of the corner is then formed by thermal oxidation in self alignment with the silicon nitride film. Along the inner periphery of the field insulating film 3, ions, for example, boron (B) are implanted and the impurities thus introduced are diffused, whereby a p-type well 14 which will be a field relaxing portion is formed as shown in FIG. 4. The impurity concentration of the p-type well 14 is, for example, set equal to or lower than that of the second semiconductor layer 2b.

A silicon oxide film is then formed over the main surface of the semiconductor substrate. Within a cell forming region surrounded by the field insulating film 3, the silicon oxide film is patterned to form a contact hole which exposes a portion of the main surface of the semiconductor substrate over which a trench gate (gate electrode) of a mesh-gate structure wherein gates are two-dimensionally arranged in the lattice form is formed. With this silicon oxide film as a mask, a trench of, for example, about 1.6 μm thick is formed in the main surface of the semiconductor substrate by dry etching. This trench separates the main surface of the semiconductor substrate into plural semiconductor island regions 2 on which a cell is to be formed.

Figure 5:
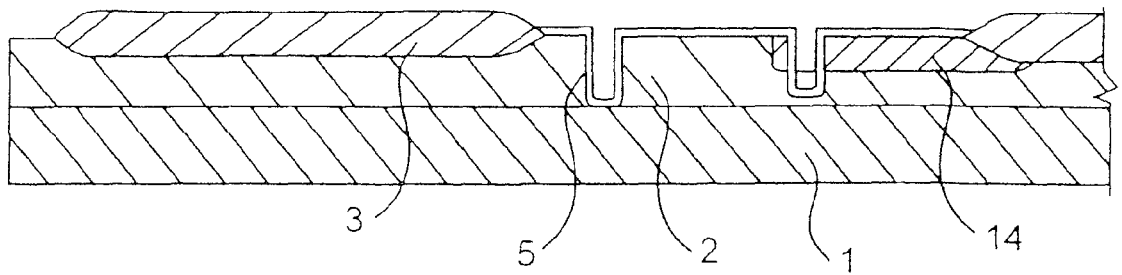
FIG. 5 is a longitudinal fragmentary cross-sectional view illustrating, in the order of steps, the semiconductor device according to Embodiment 1 of the present invention.
Figure 15:
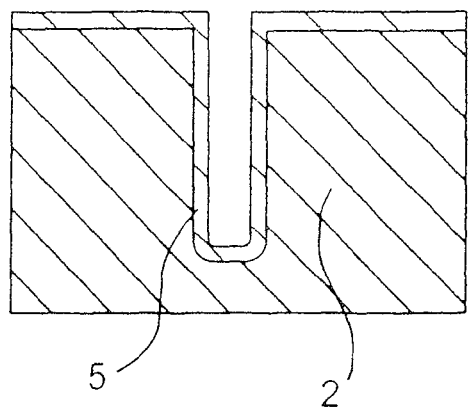
FIG. 15 is a partially-enlarged fragmentary cross-sectional view illustrating, in the order of steps, the semiconductor device according to Embodiment 1 of the present invention.

The trench formation is completed, for example, by making a trench by dry etching, removing the silicon oxide film, which will be a mask, by wet etching and then chemical dry etching to remove the angular portion at the bottom edge. A gate insulating film 5 is then formed by stacking a silicon oxide film of about 50 nm thick over a thermal oxide film of about 27 nm thick by CVD (Chemical Vapor Deposition) as illustrated in FIGS. 5 and 15.

Figure 6:
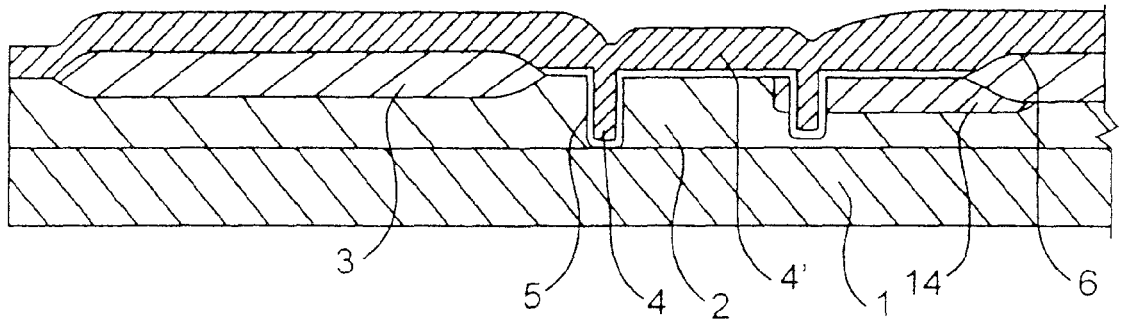
FIG. 6 is a longitudinal fragmentary cross-sectional view illustrating, in the order of steps, the semiconductor device according to Embodiment 1 of the present invention.

All over the main surface of the semiconductor substrate including the inside of the trench, a polycrystalline silicon film 4' which will be a conductive film of the trench gate, is formed by CVD. Into this polycrystalline silicon film 4', impurities (ex. phosphorus) for reducing its resistance are introduced during or after deposition. The impurity concentration is set to fall within a range of from $1E18/cm^3$ to $1E21/cm^3$ ($1 \times 10^{18}$ to $1 \times 10^{21}/cm^3$), which is higher than the that of the n⁻-type epitaxial layer 2 (main surface of the semiconductor substrate). Owing to such a high impurity concentration, accelerated oxidizing phenomenon which will be described later can be used effectively. This stage is illustrated in FIG. 6.

Figure 7:
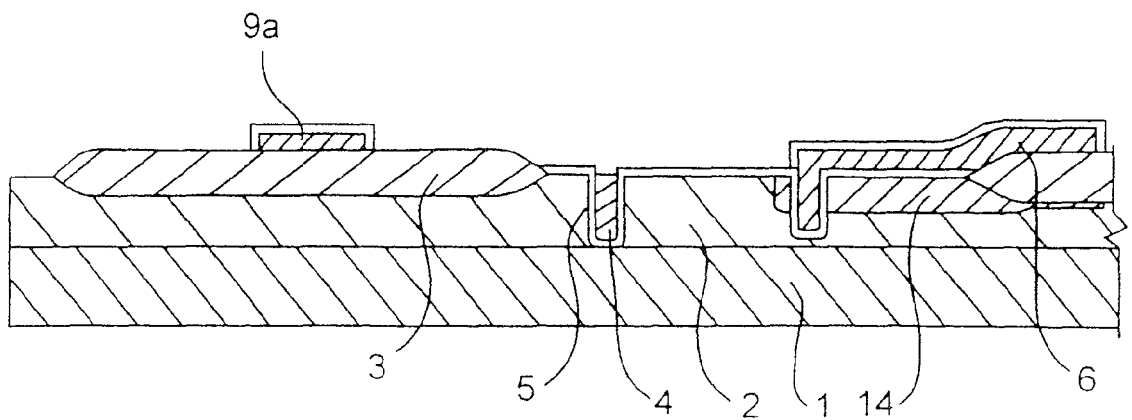
FIG. 7 is a longitudinal fragmentary cross-sectional view illustrating, in the order of steps, the semiconductor device according to Embodiment 1 of the present invention.
Figure 16:
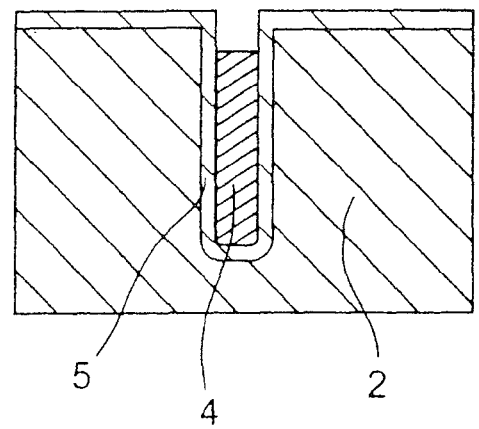
FIG. 16 is a partially-enlarged fragmentary cross-sectional view illustrating, in the order of steps, the semiconductor device according to Embodiment 1 of the present invention.

After the polycrystalline silicon film 4' is etched back by multistage oxidation wherein oxidation and etching are repeated several times and is thereby flattened, it is removed by etching, whereby a trench gate 4 is formed in the trench. Simultaneously with this etching, a gate wiring 6 connected with the trench gate 4 and a polycrystalline silicon film 9a which will lie below the gate electrode 9 are formed over the rectangular ring portion of the field insulating film 3, which are illustrated in FIGS. 7 and 16.

The flattening upon formation of the trench gate 4 prevents the formation of a concave portion on the upper surface of the trench gate 4. If the concave portion is formed, formation of an insulating film in the subsequent step is not sufficient on this concave portion and at the same time, the progress of etching is accelerated, which happens to expose the trench gate 4. The above-described flattening prevents such exposure of the trench gate 4. Flattening can alternatively be conducted by CMP (Chemical Mechanical Polishing).

Figure 8:
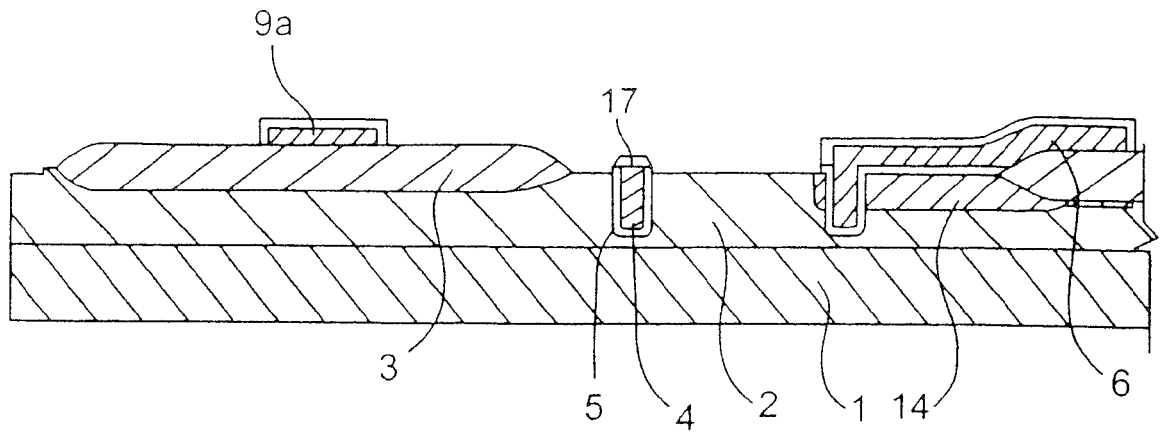
FIG. 8 is a longitudinal fragmentary cross-sectional view illustrating, in the order of steps, the semiconductor device according to Embodiment 1 of the present invention.
Figure 17:
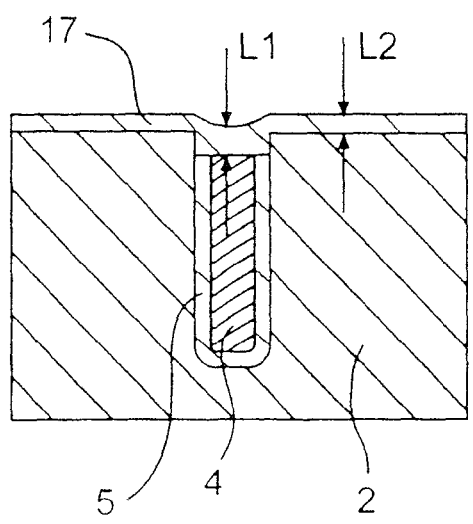
FIG. 17 is a partially enlarged fragmentary cross-sectional view illustrating, in the order of steps, the semiconductor device according to Embodiment 1 of the present invention.

The unnecessary portion of the silicon oxide film remaining on the main surface of the semiconductor substrate is then removed. After exposure of the main surface of the semiconductor substrate, an insulating film 17 made of, for example, a silicon oxide film, is formed by thermal oxidation all over the main surface of the semiconductor substrate and trench gate 4. Since the impurity concentration of the polycrystalline silicon film which constitutes the trench gate 4 is higher than that of the main surface of the semiconductor substrate, the insulating film 17 is formed, by the accelerated oxidation phenomenon, to be thicker on the trench gate 4 (thickness: L1) than on the main surface of the semiconductor substrate (thickness: L2). Upon formation of the insulating film 17 having a greater film thickness (L1) over the trench gate 4 by accelerated oxidation, the insulating film 17 is formed over the main surface of the low-concentration epitaxial layer 2 so that the film thickness (L1) of the insulating film over the trench gate 4 can be made greater than that (L2) over the main surface of the epitaxial layer 2. This stage is illustrated in FIGS. 8 and 17.

Figure 9:
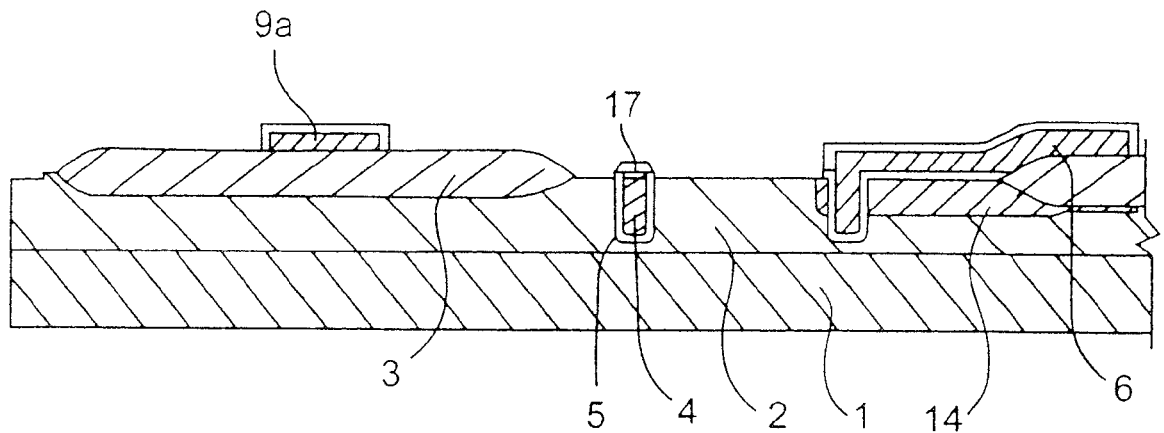
FIG. 9 is a longitudinal fragmentary cross-sectional view illustrating, in the order of steps, the semiconductor device according to Embodiment 1 of the present invention.
Figure 18:
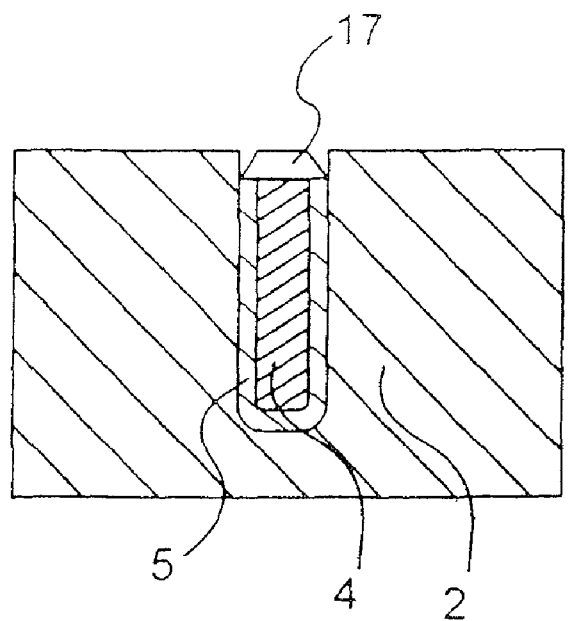
FIG. 18 is a partially-enlarged fragmentary cross-sectional view illustrating, in the order of steps, the semiconductor device according to Embodiment 1 of the present invention.

The insulating film 17 is then removed by dry etching and the main surface of the semiconductor substrate is exposed with the thickly-formed insulating film 17 being left on the trench gate 4, as illustrated in FIGS. 9 and 18.

Figure 10:
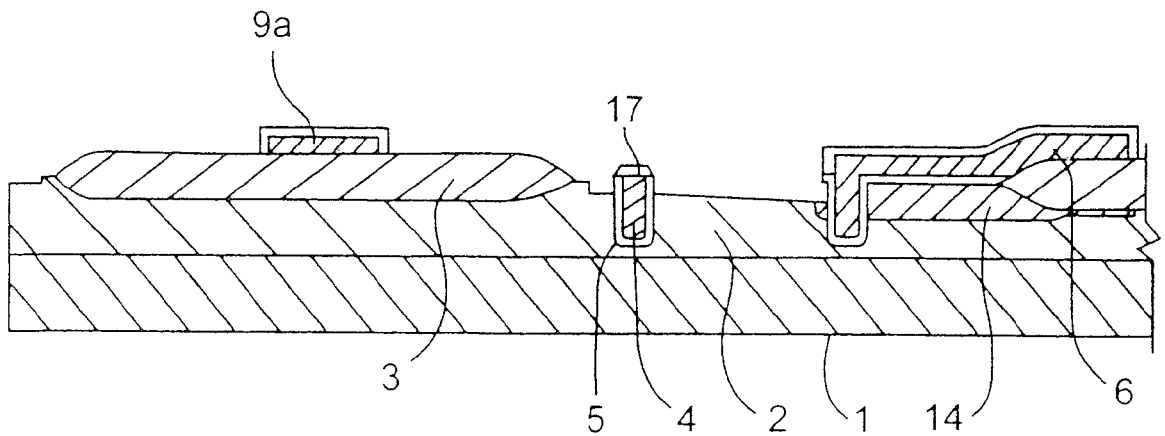
FIG. 10 is a longitudinal fragmentary cross-sectional view illustrating, in the order of steps, the semiconductor device according to Embodiment 1 of the present invention.

Dry etching is then conducted using a $CF_4$ gas to selectively remove silicon, relative to silicon oxide, from the main surface of the semiconductor substrate, whereby the main surface 2a of the semiconductor substrate is made lower than the upper surface 4a of the trench gate 4. In other words, the upper surface 4a of the trench gate 4 covered with silicon oxide is formed equal to or higher than the surface of the third semiconductor layer 2c, which will be a source region, that is, the main surface of the semiconductor substrate, as illustrated in FIGS. 10 and 19. By oxidation, the etching damage is removed and an oxide film 17a for reinforcing the gate insulating film 5 and insulating film 17 are formed as illustrated in FIG. 20.

Figure 11:
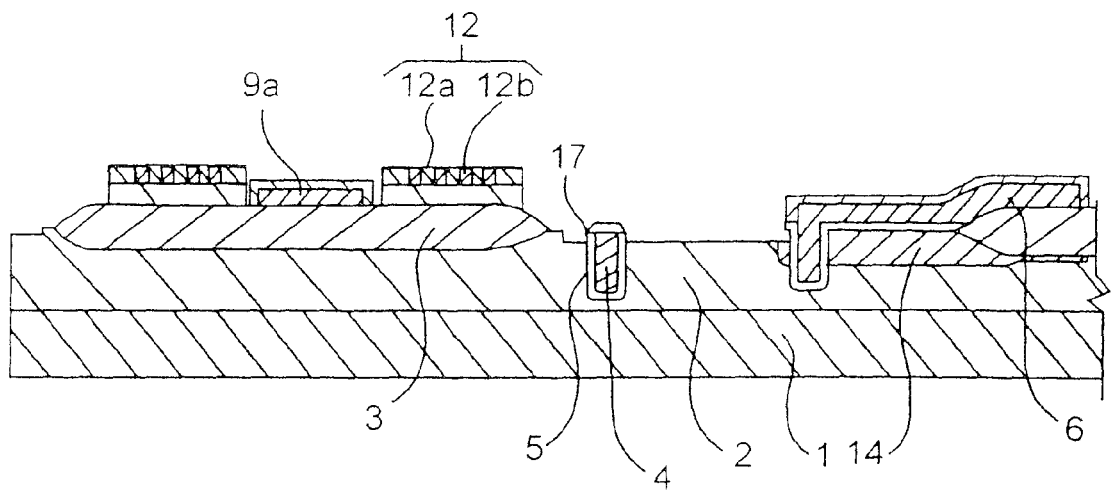
FIG. 11 is a longitudinal fragmentary cross-sectional view illustrating, in the order of steps, the semiconductor device according to Embodiment 1 of the present invention.

After formation of an insulating film 12c made of silicon oxide, a polycrystalline silicon film is deposited over the insulating film 12c. Then, p-type impurities are introduced into the polycrystalline silicon film, followed by patterning, on the rectangular portion of the field insulating film 3, into a concentric ring form surrounding the polycrystalline silicon film 9a on the gate electrode 9. Upon patterning, the insulating film 12c serves as an etching stopper for preventing the trench gate 4 and gate wiring 6 from being patterned. Then, an n⁺-type semiconductor region 12a is formed, for example, by ion implantation, whereby a protective diode 12 having the n⁺-type semiconductor region 12a and p-type semiconductor region 12b formed alternately in the concentric ring form is formed as illustrated in FIGS. 11 and 22.

Figure 12:
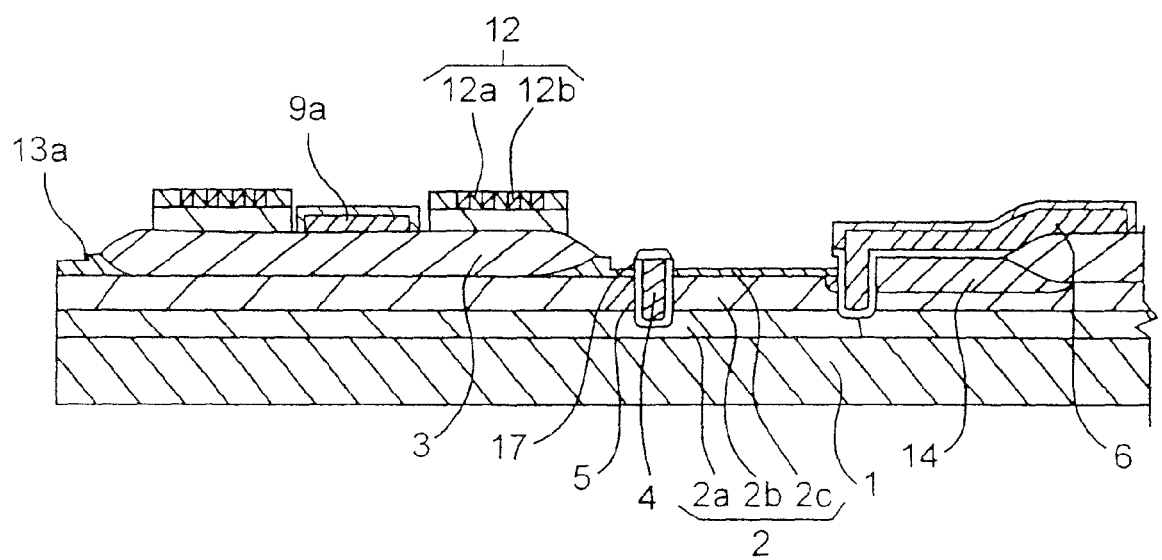
FIG. 12 is a longitudinal fragmentary cross-sectional view illustrating, in the order of steps, the semiconductor device according to Embodiment 1 of the present invention.
Figure 13:
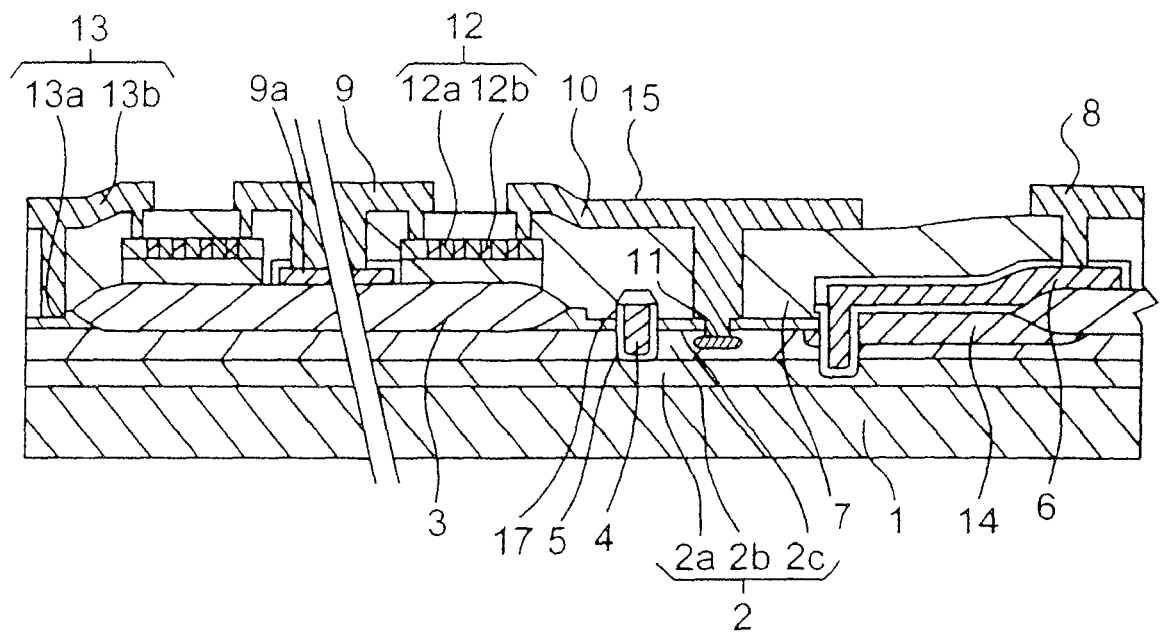
FIG. 13 is a longitudinal fragmentary cross-sectional view illustrating, in the order of steps, the semiconductor device according to Embodiment 1 of the present invention.
Figure 14:
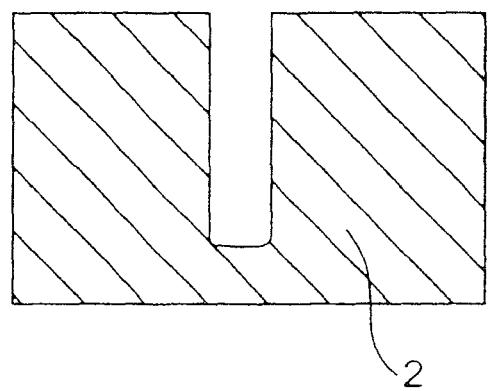
FIG. 14 is a partially-enlarged fragmentary cross-sectional view illustrating, in the order of steps, the semiconductor device according to Embodiment 1 of the present invention.

Ions such as p-type impurities (ex. boron) are then implanted all over the surface of the epitaxial layer 2, followed by diffusion treatment for about 100 minutes in a 1% $O_2$-containing nitrogen gas atmosphere at about 1100° C., whereby a p-type second semiconductor layer 2b, which will be a channel forming region, is formed. Then, ions such as n-type impurities (ex. arsenic) are selectively implanted, followed by annealing treatment for about 30 minutes in a 1% $O_2$-containing nitrogen gas atmosphere at about 950° C., whereby a third semiconductor layer 2c, which will be a source region, is formed. The deeper portion of the epitaxial layer 2 into which impurities have not been introduced, more specifically, a portion of the epitaxial layer 2 lying between the second semiconductor layer 2b and semiconductor body 1 becomes the first semiconductor layer 2a serving as a drain region. The number of the steps may be reduced by simultaneously conducting ion implantation of the n⁺-type semiconductor region 12a and the first semiconductor layer 2a. This stage is illustrated in FIGS. 12 and 21.

Since the second semiconductor layer 2b, which will be a channel forming region, and the third semiconductor layer 2c, which will be a source region, are formed by ion implantation after the main surface 2d of the semiconductor substrate is lowered relative to the upper surface 4a of the trench gate 4 by causing the semiconductor substrate to retreat, the profile in the depth direction in the semiconductor substrate 2 and the depth of each of the second semiconductor layer 2b and third semiconductor layer 2c can be controlled precisely, which makes it possible to accelerate thinning of the second semiconductor layer 2b and third semiconductor layer 2c. In short, the depth of the second semiconductor layer 2b can be controlled precisely, making it possible to control the channel length precisely.

All over the main surface of the semiconductor substrate, an interlayer insulating film 7 is formed by depositing, for example, BPSG to give a film thickness of about 500 nm.

By anisotropic dry etching using a $CHF_3$ gas, a contact hole CH (contact hole) is made in the interlayer insulating film 7 to expose each of the third semiconductor layer 2c which will be a source region, gate wiring 6, source guard ring semiconductor region 13a and a connecting region with the protective diode. All over the main surface of the semiconductor substrate including the inside of each of the contact holes, a conductive film (metal film) made of, for example, silicon-containing aluminum is formed. By patterning of the metal film, the gate guard ring 8, gate electrode 9, source wiring 10 and source guard ring 13 are formed, as illustrated in FIG. 12.

Figure 23:
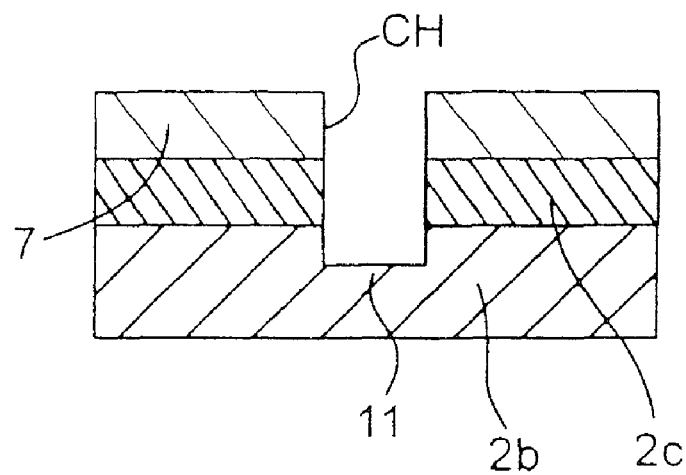
FIG. 23 is a partially-enlarged fragmentary cross-sectional view illustrating, in the order of steps, the semiconductor device according to Embodiment 1 of the present invention.
Figure 24:
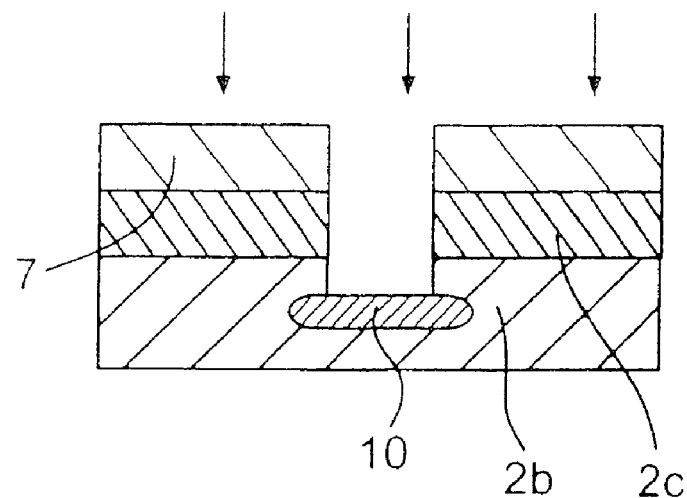
FIG. 24 is a partially-enlarged fragmentary cross-sectional view illustrating, in the order of steps, the semiconductor device according to Embodiment 1 of the present invention.

Conventionally, a contact layer 11 has been formed to extend from the main surface of the semiconductor substrate to the second semiconductor layer 2b, and with this contact layer 11 and the third semiconductor layer 2c around the contact layer 11, the source wiring 10 has been connected. In this embodiment, on the other hand, a contact hole CH is formed to extend to the second semiconductor layer 2b by etching as illustrated in FIG. 23, followed by direct introduction of p-type impurities such as boron into the second semiconductor layer 2b exposed by the contact hole CH as illustrated in FIG. 24. The p-type contact layer 11 is formed deeply by such a constitution, leading to a reduction in the generation amount of avalanche. Upon formation of the source, a mask for covering the contact layer 11 becomes unnecessary so that a subsequent photoresist step can be omitted. If the contact layer 11 is not required at the contact portion of another contact hole CH owing to the fabrication of the device into IC, it is possible to form a contact layer 11 only for a contact hole CH to be electrically connected easily with the source wiring 10 by using another mask covering the contact.

Figure 25:
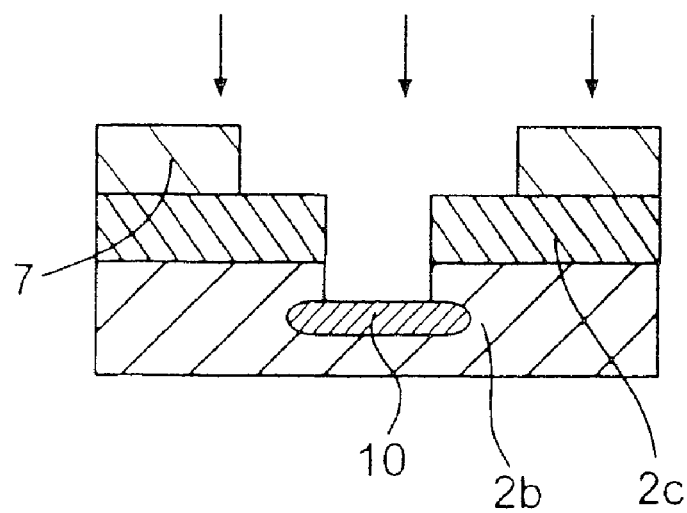
FIG. 25 is a partially-enlarged fragmentary cross-sectional view illustrating, in the order of steps, the semiconductor device according to Embodiment 1 of the present invention.
Figure 26:
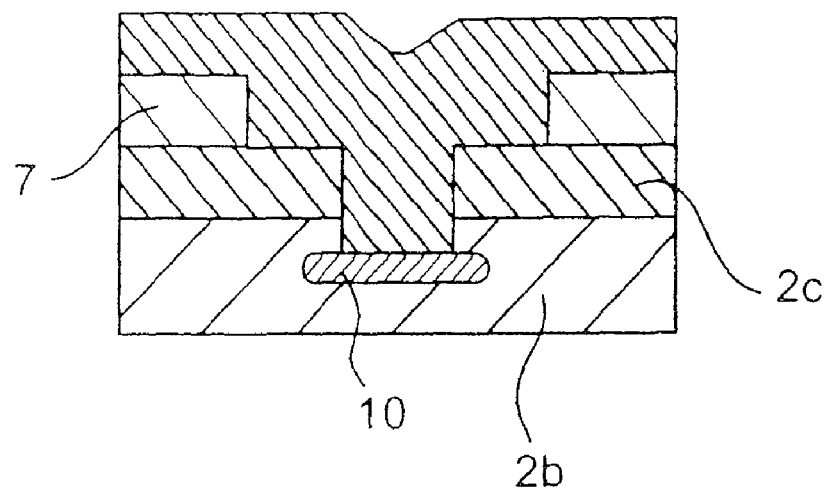
FIG. 26 is a partially-enlarged fragmentary cross-sectional view illustrating, in the order of steps, the semiconductor device according to Embodiment 1 of the present invention.

In this Embodiment, as illustrated in FIG. 25, after introduction of impurities from the contact hole CH, silicon oxide is removed from the interlayer insulating film 7 by selective etching relative to silicon in the main surface of the semiconductor substrate, whereby the surface of the third semiconductor layer 2c is exposed in self alignment with the contact hole CH. As illustrated in FIG. 26, such a constitution makes it possible to enlarge the contact area between the third semiconductor layer 2c and source wiring 10, thereby reducing the connection resistance.

In the next place, a protective insulating film 15 which covers therewith the whole main surface of the semiconductor substrate is formed by applying and stacking polyimide onto a silicon oxide film formed by plasma CVD using tetraethoxysilane (TEOS) gas as a main source gas. In the resulting protective insulating film 15, a contact hole to expose the connecting region of each of the gate electrode 9 and the source wiring 10 is formed, followed by polishing treatment on the reverse side of the n⁺-type semiconductor body 1. A drain electrode 14 is then formed, for example, by successively depositing and stacking nickel, titanium, nickel and silver on the reverse side as illustrated in FIG. 3.

In this Embodiment, the p-type well 14 is disposed as a field relaxing portion in the form of a rectangular ring. Alternatively, it is possible to make a contact hole in the field insulating film 3 and introducing impurities from this contact hole to have the p-type wells 14 studded below the field insulating film in the ring form. In this constitution, the field relaxing portion can be formed after the formation of the gate wiring 6.

Embodiment 2

Figure 28:
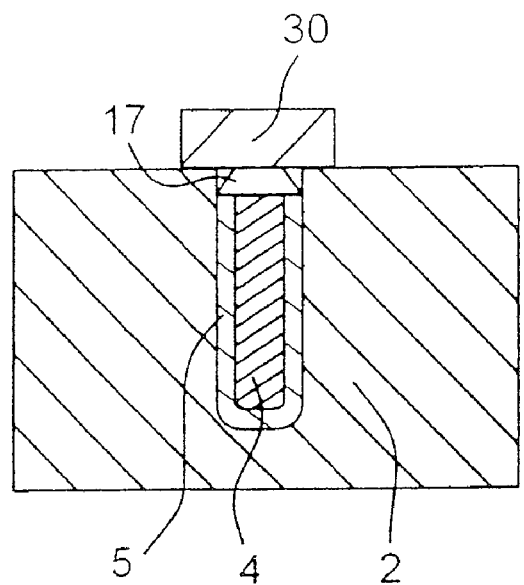
FIG. 28 is a partially-enlarged fragmentary cross-sectional view illustrating, in the order of steps, the semiconductor device according to another embodiment of the present invention.
Figure 29:
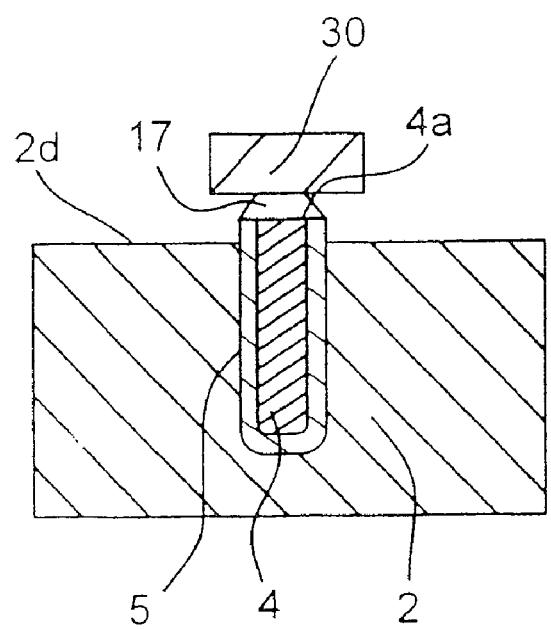
FIG. 29 is a partially-enlarged fragmentary cross-sectional view illustrating, in the order of steps, the semiconductor device according to the another embodiment 1 of the present invention.

In FIGS. 28 and 29, another embodiment of the present invention is illustrated.

This embodiment differs from the above-described one in the step for lowering the main surface 2d of the semiconductor substrate relative to the upper surface 4a of the trench gate 4. This embodiment is substantially similar to the above-described one in the other steps so a description of the other steps is omitted.

The fabricating method of the semiconductor device according to this embodiment will next be described based on FIGS. 28 and 29.

After the step of the above-described embodiment as illustrated in FIG. 18, a photoresist film 30 is for example formed, as illustrated in FIG. 28, over the insulating film 17 overlying the trench gate 4.

With the photoresist film 30 as a mask, the semiconductor substrate 2 is subjected to isotropic etching to selectively etch the semiconductor substrate 2 relative to the insulating films 5,17, whereby the main surface 2d of the semiconductor substrate is made lower than the upper surface 4a of the trench gate 4 as illustrated in FIG. 29.

The weak insulating film 17 formed by accelerated oxidation is thus protected by causing the surface of the semiconductor substrate to retreat with the photoresist film 30 over the insulating film 17 as a mask, which makes it possible to prevent the invasion of an Si etching gas into the trench gate 4 and, in turn, etching of the trench gate 4.

After the removal of the photoresist film 30, steps on and after the formation of an insulating film 17a, that is, the steps on and after FIG. 20, are conducted in a similar manner to the above-described embodiment, whereby a semiconductor device is formed.

According to this embodiment, it becomes possible to protect the weak insulating film 17 and prevent the trench gate 4 from being etched during etching of the semiconductor substrate 2 for causing the surface of the semiconductor substrate to retreat, leading to an improvement in the reliability of a semiconductor device.

The inventions made by present inventors have so far been described specifically based on the above-described embodiments. It should however be borne in mind that the present invention is not limited by them, but can be modified within an extent not departing from the scope of the present invention.

The present invention can be adapted, for example, to IGBT (Integrated Gate Bipolar Transistor), as well as power MISFET.

Advantages of the representative inventions, among the inventions disclosed by the present application, will next be described briefly.

(1) The present invention is effective for preventing a source offset by forming the upper surface of the trench-gate conductive layer equal to or higher than the main surface of the semiconductor substrate.

(2) In the present invention, the above-described advantage (1) makes it possible to promote thinning of a source.

(3) In the present invention, the above-described advantage (2) makes it possible to promote miniaturization of a cell.

What is claimed is:

1. A semiconductor device including
   a semiconductor substrate,
   a first insulating film formed in the semiconductor substrate and having a rectangular ring form,
   a MISFET formed within a region of the semiconductor substrate surrounded by the first insulating film,
   a well region of a first conductivity type formed in the semiconductor substrate and arranged below the first insulating film and along the rectangular ring form,
   the MISFET comprising:
   a semiconductor layer of a second conductivity type opposite to the first conductivity type formed in the semiconductor substrate, which serves as a drain region;
   a base region of the first conductivity type formed in the semiconductor substrate such that the base region is formed in the semiconductor substrate, in which a channel is to be formed;
   a source region of the second conductivity type formed in the semiconductor substrate such that the source region is formed over the base region, which has a pair of side surfaces opposite each other and an upper surface;
   a trench formed in the semiconductor substrate, which has contacts with the semiconductor layer, the base region and the source region;
   a gate insulating film formed inside the trench;
   a gate electrode formed over the gate insulating film and inside the trench;
   a second insulating film formed over the gate electrode and the upper surface of the source region;
   a contact hole formed in the second insulating film and the semiconductor substrate, whose bottom is located lower than the upper surface of the source region, the contact hole having contacts with the source region and the base region; and
   a source wiring formed in the contact hole electrically connected with the source region and the base region,
   wherein the source wiring has contacts with the upper surface of the source region and the side surface of the source region, and
   wherein the trench and the gate electrode extend in the well region such that a termination portion of the gate electrode extends over the first insulating film to extend a depletion layer below the first insulating film.

2. The semiconductor device according to claim 1, wherein the semiconductor layer is a silicon layer and the second insulating film is a silicon oxide film.

3. The semiconductor device according to claim 1, wherein the semiconductor layer is a single crystal silicon layer.

4. The semiconductor device according to claim 1, wherein each of the semiconductor layer and the source region is made of an n type semiconductor, and the base region is made of a p type semiconductor.

5. The semiconductor device according to claim 1, wherein the gate electrode has a mesh structure in plan view, and the gate electrodes are disposed in a lattice form.

6. The semiconductor device according to claim 1, wherein a drain electrode is formed over a back surface of the semiconductor substrate, and the drain electrode and the drain region are electrically connected.

7. The semiconductor device according to claim 1, wherein a contact layer is formed in the base region;
   the contact layer and the base region have a same conduction type;
   an impurity concentration of the contact layer is greater than that of the base region; and
   the lower portion of the contact hole and the contact layer are contacted.

8. The semiconductor device according to claim 1, wherein the well region functions as a field relaxing portion for relaxing the electric field at the termination portion of the gate electrode.

9. The semiconductor device according to claim 1, wherein the well region has an impurity concentration different from an impurity concentration of the base region.

10. The semiconductor device according to claim 9, wherein the well region functions as a field relaxing portion for relaxing the electric field at the termination portion of the gate electrode.

11. The semiconductor device according to claim 1, wherein the well region has a depth, in the substrate, different from the depth of the base region.

12. The semiconductor device according to claim 11, wherein the well region functions as a field relaxing portion for relaxing the electric field at the termination portion of the gate electrode.

* * * * *